United States Patent
Killer

(10) Patent No.: US 7,109,524 B2
(45) Date of Patent: Sep. 19, 2006

(54) METAL CARRIER (LEADFRAME) FOR RECEIVING AND CONTACT-CONNECTING ELECTRICAL AND/OR OPTOELECTRONIC COMPONENTS

(75) Inventor: Thomas Killer, Hohenschambach (DE)

(73) Assignee: Infineon Technologies AG, Munich (DE)

( * ) Notice: Subject to any disclaimer, the term of this patent is extended or adjusted under 35 U.S.C. 154(b) by 8 days.

(21) Appl. No.: 10/839,003

(22) Filed: May 5, 2004

(65) Prior Publication Data

US 2005/0001221 A1    Jan. 6, 2005

(30) Foreign Application Priority Data

May 6, 2003    (DE)    ............... 103 21 257

(51) Int. Cl.
   *H01L 23/00*    (2006.01)
(52) U.S. Cl. .......................... 257/82; 257/79
(58) Field of Classification Search ............ 257/80–82
   See application file for complete search history.

(56) References Cited

U.S. PATENT DOCUMENTS

| | | | |
|---|---|---|---|
| 3,795,044 A | | 3/1974 | Peltz |
| 5,089,861 A | * | 2/1992 | Tanaka et al. ................. 372/36 |
| 5,367,530 A | * | 11/1994 | Noishiki et al. ......... 372/43.01 |
| 5,619,065 A | | 4/1997 | Kim |
| 6,531,328 B1 | | 3/2003 | Chen |
| 2001/0009599 A1 | * | 7/2001 | Kato et al. ..................... 385/92 |
| 2002/0001869 A1 | | 1/2002 | Fielstad |
| 2002/0004251 A1 | | 1/2002 | Roberts et al. |
| 2002/0163006 A1 | * | 11/2002 | Yoganandan et al. ......... 257/81 |

FOREIGN PATENT DOCUMENTS

| EP | 0 690 515 A1 | 1/1996 |
|---|---|---|
| WO | WO 02/17405 A1 | 2/2002 |

* cited by examiner

*Primary Examiner*—Thomas L. Dickey
(74) *Attorney, Agent, or Firm*—Eschweiler & Associates, LLC

(57) ABSTRACT

The invention relates to a metal carrier (leadframe) for receiving and contact-connecting electrical and/or optoelectronic components. According to the invention, the metal carrier has at least two regions of different thickness. This opens up the possibility of fitting even relatively thick electrical or optoelectronic components on a leadframe with a predetermined overall structural height.

20 Claims, 3 Drawing Sheets

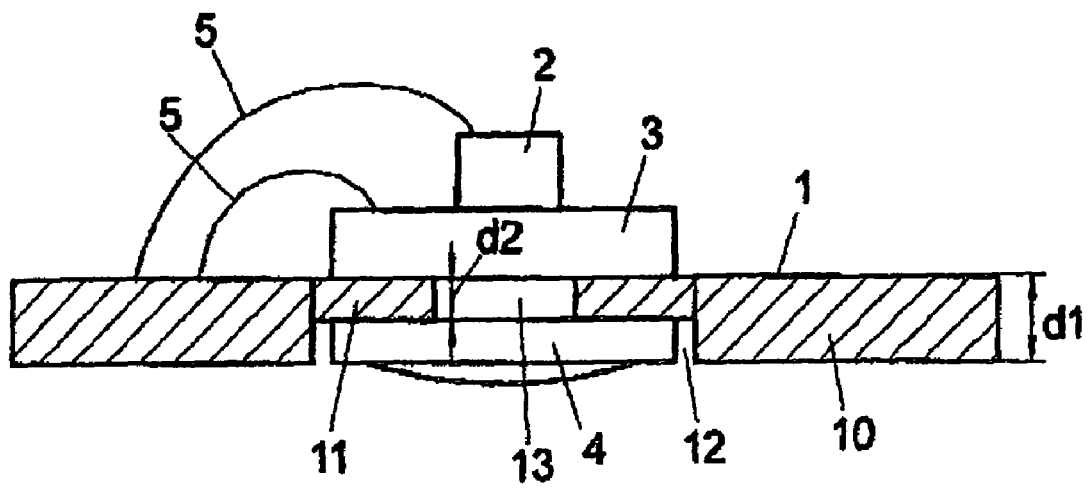
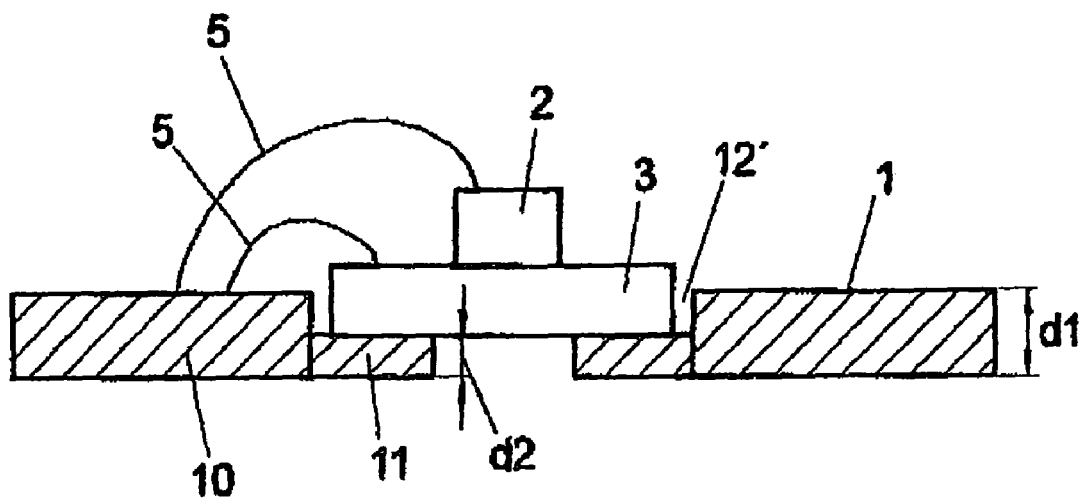

METAL CARRIER (LEADFRAME) FOR RECEIVING AND CONTACT-CONNECTING ELECTRICAL AND/OR OPTOELECTRONIC COMPONENTS

REFERENCE TO RELATED APPLICATIONS

This application claims the benefit of the priority date of German application DE 103 21 257.4 filed on May 6, 2003, the contents of which are herein incorporated by reference in their entirety.

FIELD OF THE INVENTION

The invention relates to a metal carrier (leadframe) for receiving and contact-connecting electrical and/or optoelectronic components and to an electrical or optoelectronic arrangement having such a metal carrier.

BACKGROUND OF THE INVENTION

Metal carriers are known which serve for contact-connecting an electrical or optoelectronic component and, for this purpose, generally provide a multiplicity of small contact legs via which the component can be electrically contact-connected. In this case, bonding wires are respectively placed between the small contact legs of the metal carrier and contact pads of the component. Such metal carriers are also referred to as leadframes.

The finished arrangement of leadframe, component and bonding wires is usually potted with a potting material. By way of example DE 199 09 242 A1 discloses an arrangement in which a leadframe with an optoelectronic transducer is positioned in a module housing open at one side and is potted with a light-transmissive, moldable material. Light is coupled in or out via an optical fiber coupled to a connector of the module housing. The driver module or reception module for the optoelectronic transducer is also situated on the leadframe.

In other configurations, leadframes with optical and optoelectronic components are incorporated in standard plastic housings. There is a need to accommodate the thickest possible chip modules in such standard housings and at the same time to have a certain freedom of configuration in the arrangement of the components, for instance for setting-the optical length of an optical system used.

SUMMARY OF THE INVENTION

The present invention is based on the object of providing a metal carrier (leadframe) and an electrical or optoelectronic arrangement having a metal carrier which enable improved fitting of electrical or optoelectronic components in standard housings and in the process provide, in particular, additional degrees of freedom in the arrangement of the components.

Accordingly, the invention is distinguished by the fact that the metal carrier (leadframe) has at least two regions of different thickness. This opens up the possibility of fitting even relatively thick electrical or optoelectronic components on a leadframe with a predetermined overall structural height. The electrical or optoelectronic components are in each case arranged in a region of reduced thickness. The additional structural space furthermore gives rise to additional degrees of freedom in the arrangement of the individual elements on the leadframe. By way of example, there are additional degrees of freedom available for the arrangement of optical elements on the leadframe.

It may also be provided that a plurality of elements are arranged one above the other, if appropriate on different sides of the leadframe in the region of reduced thickness.

Since the leadframe has a reduced thickness only partially, but not throughout, the mechanical properties of the leadframe are changed only slightly, so that it can still be handled easily.

A metal carrier in the sense of the present invention is understood to be any carrier which is metallic or metallized or provided with a conductive area and serves for fixing and contact-connecting electrical and/or electro-optical components. In this case, contact pads of the components to be contact-connected are electrically connected to corresponding contact regions of the metal carrier by means of bonding wires or directly. The contact regions are generally formed as small contact legs or have the latter, the small contact legs for their part being electrically contact-connected at their end remote from the component. The metal carrier preferably comprises a stamped or etched metal foil. It is planar or has at least one planar receiving region for receiving and fixing a component to be contact-connected. Such metal carriers are generally referred to as leadframes.

Preferably, at least one region of the metal carrier is present which has a reduced thickness. In this case, this region of reduced thickness advantageously has outer contours such that it is suitable for receiving an optical, electrical or optoelectronic component. These may in this case be introduced into a standard housing with a reduced overall structural height.

It is particularly advantageous if the outer contours of the region of reduced thickness form a passive alignment structure for an optical, electrical or optoelectronic component to be fitted in said region. Simple mechanical alignment of a device is made possible in this way. This refinement is advantageous particularly in the case of a POF (Plastic Optical Fiber) application, which have moderate tolerance requirements. In the case of a non-optical application, the alignment structure may serve for example for receiving and orienting a heat sink.

The region of reduced thickness may in principle have any desired form. It is preferably rectangular, so that chips or chip modules can be mounted in the region of reduced thickness in a simple way and in a defined orientation.

By way of example, an optical lens or a carrier substrate for an electrical or optoelectronic component is arranged in the region of reduced thickness.

The region of reduced thickness is preferably produced by partial thinning of a standard leadframe. By using a standard leadframe which is partially thinned, it is possible to have recourse to standard technologies for producing the leadframe. In this case, both the production of the standard leadframe and the subsequent thinning are preferably effected by means of a standard technology. The production method is accordingly suitable for high volumes.

During the thinning of a standard leadframe, the nominal (normal) leadframe thickness may essentially be retained. Accordingly, virtually all manufacturing installations of the standard technology used can continue to be utilized without modification. The leadframe is also essentially in line with the standard with regard to its mechanical properties.

A preferred method for producing the leadframe according to the invention is effected by means of half-sided etching of a carrier in accordance with the "half-etch" technique known per se. Customary patterning of leadframes by means of etching provides for a starting material to be masked on both sides and to be etched from each side until the non-masked material is completely removed. In the case of the half-etch technique, etching is effected only from one side; the other side is masked in the region under consideration. In this case, the depth achieved is dependent on the etching time and can be chosen freely, in principle. In this way, a leadframe can be partially thinned on one side.

However, other production methods are also possible, of course. By way of example, the region of reduced thickness may be produced by pressing, milling or laser ablation of a starting carrier.

The region of reduced thickness preferably amounts to between 30% and 70%, particularly preferably between 50% and 60%, of the thickness of the region that is not of reduced thickness. Given a leadframe thickness of 125 µm, the region of reduced thickness has for example a thickness of approximately 55 µm, thereby gaining 70 µm of structural height. The gain of structural height is correspondingly larger in the case of thicker leadframes, leadframes usually having a thickness of up to 300 µm.

The invention also relates to an electrical and optoelectronic arrangement having at least one electrical or optoelectronic component arranged on a metal carrier.

In this case, an optical, electrical or optoelectronic component is arranged in the region of reduced thickness, so that the overall structural height is reduced and there is a greater freedom of configuration in the arrangement of the elements.

BRIEF DESCRIPTION OF THE DRAWINGS

The invention is explained in more detail below using a plurality of exemplary embodiments with reference to the figures of the drawings, in which:

FIG. 1 shows a first exemplary embodiment of a leadframe having regions of different thickness, FIG. 2 shows a second exemplary embodiment of a leadframe having regions of different thickness.

DETAILED DESCRIPTION OF THE INVENTION

Figure 3:
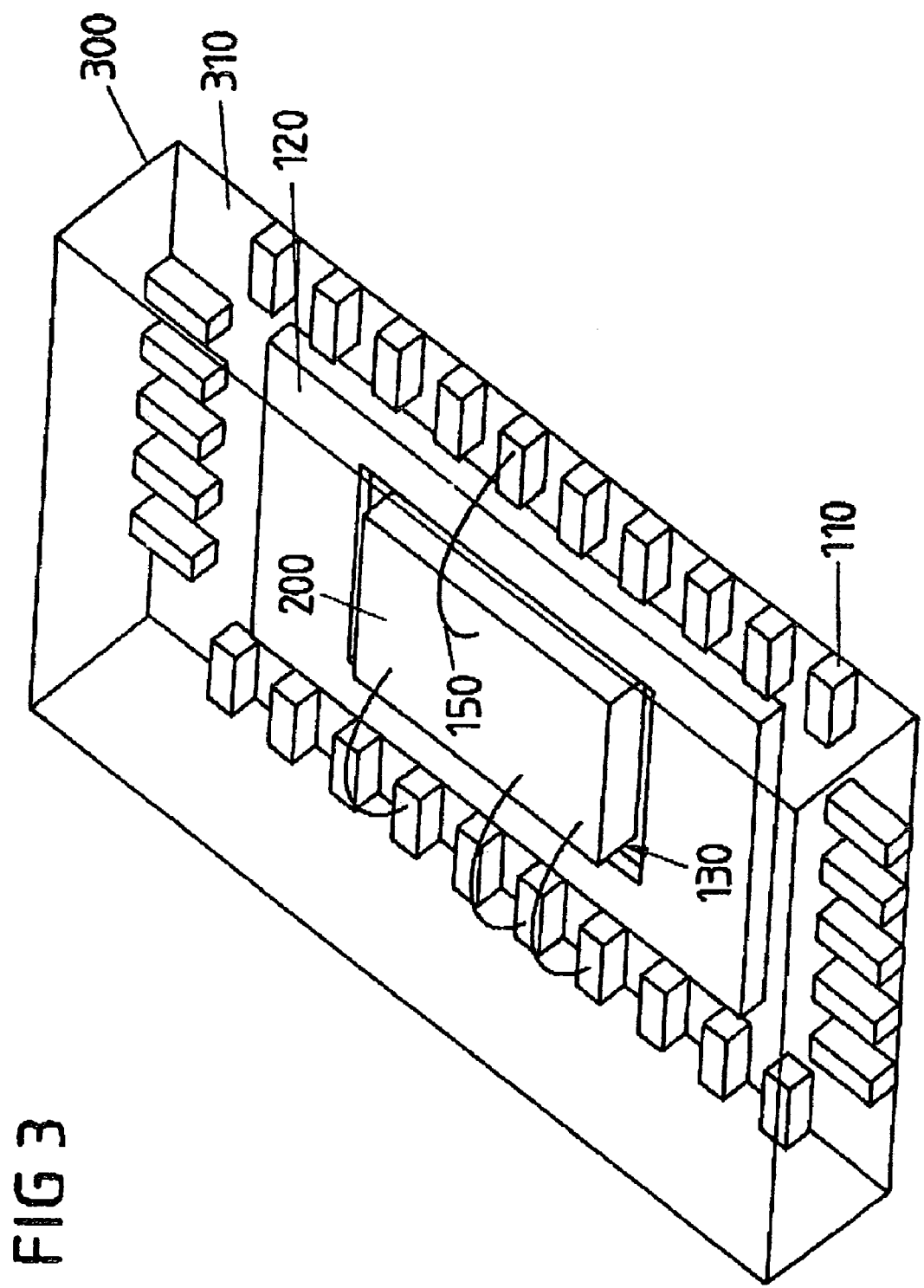
FIG. 3 shows a third exemplary embodiment of a leadframe having regions of different thickness in a perspective view from above.

FIG. 1 shows a metal carrier (leadframe) 1, which serves for receiving and contact-connecting an optoelectronic component 2, 3. The metal carrier 1 has a first region 10 having a first thickness d1 and a second region 11 having a reduced thickness d2 by comparison therewith. The region of reduced thickness 11 accordingly forms a cutout 12 in the metal carrier 1. An optical lens 4 is arranged in centered fashion in the cutout 12. An optoelectronic component 2 is situated on a submount 3 on the top side of the leadframe. In this case, the submount 3 is arranged on the metal carrier 1 in the region 11.

The optoelectronic component 2 is for example a light-emitting diode, a laser diode or a photodiode. The submount or carrier 3 comprises silicon or sapphire, for example. The optoelectronic component 2 is contact-connected via bonding wires 5, which are connected on the one hand to corresponding contact regions of the metal carrier 1 and on the other hand to metallizations or bonding pads of the submount 3 and of the optoelectronic component 2 (not illustrated separately). However, the way in which the components are contact-connected is to be understood only as an example. By way of example, the optoelectronic component 2 can also be mounted and contact-connected on the metal carrier 1 by flip-chip mounting.

The metal carrier 1 thus serves on the one hand for receiving and retaining the components 2, 3, 4 and on the other hand, in a manner known per se, for electrically contact-connecting the optoelectronic component 2.

The overall structural height of the optoelectronic module illustrated is reduced on account of the reduced thickness d2 of the leadframe 1 in the region 11. In this case, the lens 4 can be positioned nearer to the optoelectronic component 2. This provides an additional degree of freedom for the adaptation of the optical system.

Furthermore, the defined step in the metal carrier 1 provided by the cutout 12 affords the possibility of simple alignment of the lens 4 in the leadframe 1 and thus indirectly also with respect to the transmission or reception component 2. This arrangement is suitable for POF applications, in particular, since moderate tolerance requirements exist for the latter.

It is pointed out that, in the exemplary embodiment illustrated, the leadframe 1 has a cutout 13 centrally, through which light emitted or received by the optoelectronic component 2 can pass through the leadframe. The leadframe 1 may have a plurality of such or other cutouts.

FIG. 2 shows an alternative embodiment, in which a lens 4 is not provided. In this exemplary embodiment, the cutout 12' is formed on the top side of the leadframe and the submount 3 is inserted into said cutout 12'. The overall structural height of the arrangement is significantly reduced in this case, too. By way of example, the thickness d1 amounts to 125 µm and the thickness d2 amounts to 55 µm, so that approximately 70 µm of structural height are gained.

The smaller metal-sheet thickness in the region of reduced thickness d2 additionally affords the advantage of a shorter distance of the optical path out of the overall package. This provides a degree of freedom in the optical design.

In the case of FIG. 2 as well, the region 11 of reduced thickness or the cutout 12' is patterned in such a way as to provide a passive alignment structure in the leadframe 1, for receiving the submount 3 in the present exemplary embodiment.

The individual contact regions or small leadframe legs of the metal carrier 1 are provided at their outer edge for a further contact-connection, for instance to the electrical lines of a circuit board (not illustrated). This corresponds to the customary construction of a leadframe, and so this will not be discussed in any further detail.

The configuration of the invention is not restricted to the exemplary embodiments presented above. In particular, instead of optoelectronic components, optical components may equally be arranged on the partially thinned leadframe. The use of a partially thinned leadframe is suitable, in principle, for all construction concepts with relatively high chips or multichip modules which are intended to be arranged in a standard housing with a standard height or in the case of which the structural height is intended to be restricted for a different reason.

In further configurations of the invention, the exemplary embodiments of FIGS. 1 and 2 are combined, in which case it may be provided that the leadframe is partially thinned on the top side and underside. It may equally be provided that the leadframe forms more than two regions of different thickness. Moreover, a multiplicity of regions of reduced thickness may be arranged at a distance from one another in a leadframe, a chip or a multichip module being mounted in each region.

Figure 4:
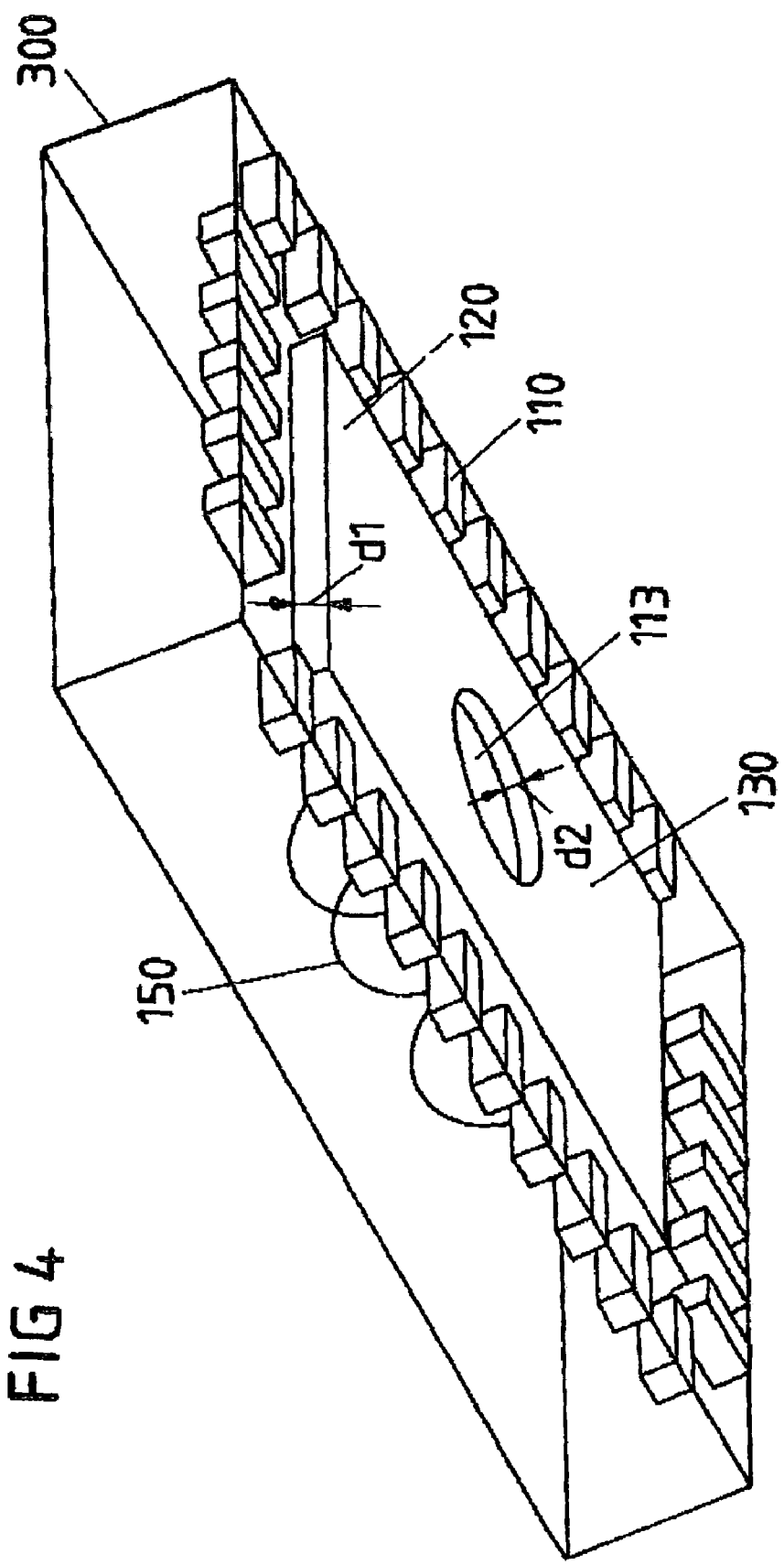
FIG. 4 shows the embodiment of FIG. 3 in a perspective view from below.

FIGS. 3 and 4 show a further embodiment of a metal carrier with an area of reduced thickness. The metal carrier comprises a die pad 120 and a plurality of leads 110 located around the edge of the metal carrier. The die pad 120 has a central region 130 of reduced thickness d2 (see FIG. 4) in which an optoelectronic chip 200 is located. The chip 200 is located directly on the die pad 120 in its region 130 of reduced thickness. Alternatively, the chip 200 may be located on a submount similar to the embodiments of FIGS. 1 and 2.

As can be seen from FIG. 4, the die pad 120 comprises in its region of reduced thickness 130 a cutout 113. Through this cutout 113 light can be emitted or received by the optoelectronic chip 200. The optoelectronic chip 200 is contacted by means of a plurality of bonds 150 which reach from leads 110 of the leadframe to corresponding contact pads (not shown) on the top of the optoelectronic chip 200.

The leadframe and the chip 200 are parts of a package 300, with a non-transparent moulding mass 310 covering the top of the leads, the die pad and the chip, thereby forming a cuboid 300. However, as can been seen in FIG. 4, the bottom side of the leads 110 and of the die pad 120 are not covered by the moulding mass 310. Such arrangement is known as an "exposed die pad", and it forms a leadless package that can be surface mounted on a printed circuit board.

It is pointed out that the die pad 120 and the region of reduced thickness 130 are used solely to accommodate the chip 200 with the effect that the overall height of the package is reduced. The area of reduced thickness is not used for electrically contacting the chip 200 except for, possibly, providing GROUND contact. The electrical contact is provided by leads 110 which do not have a reduced thickness.

The embodiment of FIGS. 3 and 4 may be combined with features of the embodiments of FIGS. 1 and 2. For example, there may be an lens coupled to the cutout 113.

In an alternative embodiment, the package has leads that extend beyond the package (leaded package).

The invention claimed is:

1. A leadframe for receiving and contact-connecting electrical and/or optoelectronic components, comprising:
   first and second regions of different thickness;
   a die pad for arrangement of an electric or optoelectronic chip thereon;
   a plurality of leads located at one or more edges of the leadframe, wherein the second region resides in the die pad; and
   wherein the leadframe and the electric or optoelectronic chip located in the second region of the die pad form a package that is moulded with a non transparent moulding mass.

2. The leadframe of claim 1, wherein the second region is surrounded by the first region, and has a thickness less than that of the first region.

3. The leadframe of claim 2, wherein the second region has an outer contour suitable for receiving an optical, electrical or optoelectronic component.

4. The leadframe of claim 3, wherein the outer contour of the second region forms a passive alignment structure for an optical, electrical or optoelectronic component to be fitted therein.

5. The leadframe of claim 2, wherein the outer contour of the second region has a rectangular form.

6. The leadframe of claim 2, further comprising an optical lens arranged in the second region.

7. The leadframe of claim 2, further comprising a carrier substrate for an electrical or optoelectronic component arranged in the second region.

8. The leadframe of claim 2, wherein the second region is produced by partial thinning of a standard leadframe.

9. The leadframe of claim 8, wherein the second region is produced by half-sided etching of a carrier.

10. The leadframe of claim 8, wherein the second region is produced by pressing, milling or laser ablation of a carrier.

11. The leadframe of claim 2, wherein the second region has a thickness amounting to between 30% and 70% of the thickness of the first region.

12. The leadframe of claim 1, wherein the electric or optoelectronic chip is located directly on top of the second region associated with the die pad.

13. The leadframe of claim 12, wherein the electric or optoelectronic chip is connected to corresponding leads of the leadframe by means of bonds connected to a top of the chip.

14. The leadframe of claim 1, wherein the package has an essentially cuboid form.

15. The leadframe of claim 1, wherein the leads are located at a bottom of the package forming a leadless package that is surface mountable.

16. The leadframe of claim 1, wherein the second region in the die pad serves to physically hold the chip and does not provide electrical contacts, except for a circuit ground potential contact.

17. An electrical or optoelectronic arrangement having at least one electrical or optoelectronic component arranged on a leadframe, wherein the leadframe comprises the leadframe of claim 1, with an optical, electrical or optoelectronic component arranged in at least one second region.

18. The arrangement of claim 17, further comprising another optical, electrical or optoelectronic component or element arranged above the other component in the second region.

19. The arrangement of claim 18, further comprising an optical lens, wherein the optoelectronic component and the optical lens are arranged one above the other on different sides of the second region.

20. A leadframe for receiving and contact-connecting electrical and/or optoelectronic components, comprising:
   first and second regions of different thickness;
   a die pad for arrangement of an electric or optoelectronic chip thereon;
   a plurality of leads located at one or more edges of the leadframe, wherein the second region resides in the die pad;
   wherein the die pad comprises a central cutout; and
   wherein the chip is an optoelectronic chip and wherein light emitted or received by the optoelectronic chip passes through the cutout in the die pad and a bottom of the package, while a top of the chip is covered with a non-transparent moulding mass.

* * * * *